United States Patent [19]

Hallman et al.

[11] 4,267,261
[45] * May 12, 1981

[54] METHOD FOR FULL FORMAT IMAGING

[75] Inventors: Robert W. Hallman, San Diego, Calif.; Stanford R. Ovshinsky, Bloomfield Hills, Mich.; John P. de Neufville, Mendham, N.J.

[73] Assignee: Energy Conversion Devices, Inc., Troy, Mich.

[*] Notice: The portion of the term of this patent subsequent to Dec. 28, 1993, has been disclaimed.

[21] Appl. No.: 577,003

[22] Filed: May 13, 1975

Related U.S. Application Data

[63] Continuation-in-part of Ser. No. 162,842, Jul. 15, 1971, abandoned.

[51] Int. Cl.³ .................. G03C 5/04; G03C 5/24; B05D 3/06
[52] U.S. Cl. .................. 430/322; 430/302; 430/330; 430/346; 427/56.1
[58] Field of Search ............ 96/48 PQ, 48 R, 88, 96/27 R, 27 E, 44; 250/316, 317; 427/53, 56, 43; 430/346, 302, 322, 330

[56] References Cited

U.S. PATENT DOCUMENTS

| | | | |
|---|---|---|---|
| 3,392,020 | 7/1968 | Yutzy et al. | 250/317 |
| 3,451,813 | 6/1969 | Kinney et al. | 96/36.2 |
| 3,476,578 | 11/1969 | Brinckman | 250/317 |
| 3,522,047 | 7/1970 | Kishida et al. | 250/317 |
| 3,549,733 | 12/1970 | Caddell | 96/35.1 |
| 3,574,657 | 4/1971 | Burnett | 427/56 |
| 3,678,852 | 7/1972 | Feinleib et al. | 96/88 |
| 3,679,410 | 7/1972 | Yrancken et al. | 250/316 |
| 3,715,210 | 2/1973 | Watkinson et al. | 96/33 |
| 3,716,844 | 2/1973 | Brodsky | 96/88 |
| 3,753,705 | 8/1973 | Goffe | 96/27 R |
| 3,792,266 | 2/1974 | Gundlach | 427/56 |
| 3,804,620 | 4/1974 | Wells | 96/33 |
| 4,000,334 | 12/1976 | Hallman et al. | 96/48 PQ |

FOREIGN PATENT DOCUMENTS 1286503 8/1972 United Kingdom.

OTHER PUBLICATIONS

Harris et al., "Continuous Wave Laser ... Film", *Image Technology*, vol. 12 No. 13 pp. 31–35 Apr./May 1970.
*Physical Properties of Kodak Estar Base Films*, Eastman Kodak Co., Rochester, N. Y. 1964.

*Primary Examiner*—Richard L. Schilling
*Attorney, Agent, or Firm*—Wallenstein, Spangenberg, Hattis & Strampel

[57] ABSTRACT

In a method for full format imaging, a solid continuous film of a dispersion imaging material is provided on a substrate and it disperses into a discontinuous film comprising space globules and free space therebetween through which free space light can pass where it is subjected to a short pulse of high intensity non-coherent radiant energy in an amount sufficient to increase the absorbed energy above a certain threshold value. The short pulse of high intensity non-coherent radiant energy is applied to the solid continuous film, through a mask, simultaneously and substantially evenly in a full format pattern to a plurality of areas thereof to cause simultaneous and substantially even dispersion of the continuous film in those pattern areas into a discontinuous film comprising the spaced globules and free space which are substantially evenly distributed in those pattern areas and through which free space light can pass. A stable finished full format image of said discontinuous film in the solid continuous film corresponding to the full format pattern of energy is rapidly and inexpensively produced and which has high contrast between the imaged and unimaged regions.

22 Claims, 8 Drawing Figures

METHOD FOR FULL FORMAT IMAGING

This application is a continuation-in-part of application Ser. No. 162,842, filed July 15, 1971, for METHOD FOR PRODUCING IMAGES (now abandoned).

The present invention relates to a new method for producing full format images and duplicates of images by the use of a dispersion imaging material.

Most methods presently used for full format imaging or producing duplicates of images require pre-exposure protection of the imaging material and development and fixing of the material after exposure. Because of the inconvenience introduced by these requirements much effort has been expended to provide new imaging materials and imaging methods which simplify the handling of the imaging materials. Various materials are now available, which do away with at least one or the other of the requirements.

The present invention provides a new full format imaging system which requires no safe lighting, no development of the exposed material and no fixing. In other words, simple full format exposure, for example through a mask, produces the finished, permanent stable image by dispersion of a dispersion imaging material.

Briefly, this invention is directed to the method of producing an image by full format imaging and utilizes on a substrate a solid continuous film of a dispersion imaging material which can be either crystalline or amorphous. This dispersion imaging material, upon application of a pulse of high intensity non-coherent radiant energy in an amount sufficient to increase the absorbed energy in the material above a threshold value, is capable of changing to a substantially molten state in which the surface tension of the material acts to cause the continuous film, where subject to said energy, to change to a discontinuous film comprising spaced globules and free space therebetween in the film which are frozen in place following said energy pulse and through which free space light can pass.

This invention also comprises the step of applying a short pulse of high intensity non-coherent radiant energy to said continuous film of dispersion imaging material simultaneously and substantially evenly in a full format pattern. The full format pattern of simultaneously and substantially evenly applied short energy pulse includes a plurality of regions or areas in which the intensity and pulse width of the energy is sufficient to increase simultaneously and substantially evenly the absorbed energy in the corresponding pattern regions or areas of the dispersion imaging material above the threshold value, and wherein the amount of radiant energy supplied in other regions or areas is insufficient to increase the absorbed energy above said threshold value. As a result, the material of the continuous film in those pattern regions or areas simultaneously and substantially evenly receiving the higher amount of the energy pulse is caused to change to the discontinuous film comprising the spaced globules and free space which are substantially evenly distributed in said pattern regions or areas and through which free space light can pass to provide at one time a stable finished full format image pattern of said discontinuous film in the continuous film corresponding to the full format pattern of the energy pulse.

The term full format imaging as used herein means imaging simultaneously a plurality of areas, as distinguished from serially scanning such areas, and while that term contemplates the simultaneous imaging of a complete frame, it also contemplates simultaneously individually imaging complete designations, such as, letters, numbers, graphics, and the like, and combinations thereof, but constituting less than a complete frame.

Various authors have reported that scanning lasers can be used for real-time thermal recording on various thin film materials, these articles being as follows: (1) "Helium-Neon Laser: Thermal High-resolution Recording" by C. O. Carlson, Stone, Bernstein, Tomita and Myers, reported in *Science*, 154, 1550 (1966); (2) "Some Considerations In The Design of A Laser Thermal Microimage Recorder" by Carlson and Ives, reported in Session 16, Optics and Electro-optics in Computers, 1968, published by *Westcon Technical Papers*, 1968, pages 1 to 8; and (3) "Continuous Wave Laser Recording On Metallic Thin Film" by Harris, Chin and Bernstein, reported in *Image Technology, Volume* 12, No. 3, page 31, April/May, 1970. These authors all appear to have been associated with National Cash Register Company (NCR) and these NCR articles all pertain to a work project presumably carried out at that company.

The first NCR article discloses scan line heat made recording by a moving focused laser spot from a Helium-Neon laser Gaussian shaped beam on thin metal films including lead and tantalum and a film of a triphenylmethane die in a plastic binder. Line pattern recording and page recording by means of a facsimile-type optical scanner are described.

Figure 1:
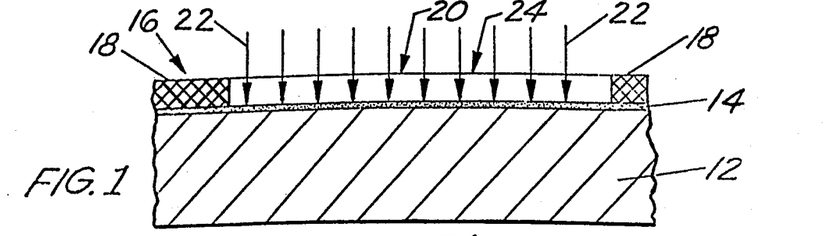
Figure 2:
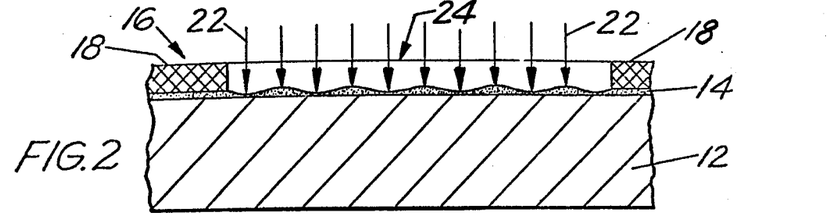
Figure 3:
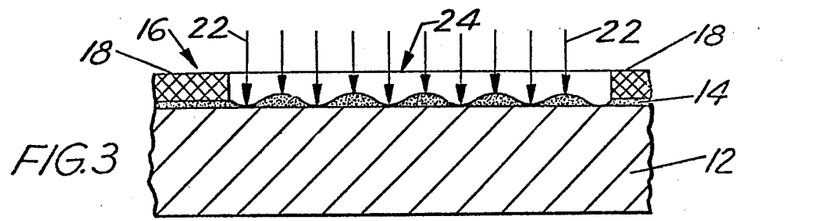
Figure 4:
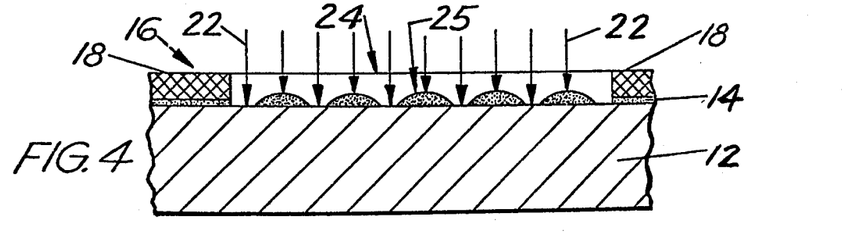

The second NCR article discloses a bread board design of a scanning laser heat mode recorder which produces microimages. Here, also, a moving focused laser recording spot is utilized from a Gaussian shaped Helium-Neon laser beam. The scanning laser beam spot records on a thin film of evaporated Bismuth or triphenylmethane in a plastic binder using electronic signals and a raster scanning mode similar to a standard television system. The article refers to a scanning recording time of 1.6 seconds. FIG. 1 of this NCR article relates beam power to spot diameter showing that the power, and, hence, the energy to be absorbed, is greatest in the center of the spot and decreases radially from the spot center (Gaussian curve). In fact, the recorded spot falls between one-third to two-thirds of the nominal spot diameter of the focused recording beam. As a result, the energy is not substantially even throughout the spot, resulting in different degrees of heating of the film within the spot area.

The third NCR article also discloses scan line heat mode recording by a moving focused laser spot on thin metallic films. Various types of lasers, including Argon, He-Ne and YAG, are disclosed and the metallic films are disclosed to be Bismuth, Cadmium, Gold, Cobalt and Zirconium. Line pattern recording and electronic generated character recording are described. This article refers to the formation of small globules resulting from the heat generated by the focused laser spot and melting of the film in the spot. As can be seen from the various photomicrographs, the globules are not substantially evenly distributed in the laser spot irradiated areas.

The laser beam heat mode recording methods of the NCR articles operate to produce directly original records, require serial line scanning by a high intensity focused laser beam which comprises coherent radiant energy and which scanning methods are a time consuming process in the range of seconds, utilize relatively expensive laser recording equipment, require close coupling or matching of time, power input and resolution to obtain a usable system, and cannot provide substantially even distribution of the globules in the laser irradiated areas. Also, the lasers have discrete wavelength outputs of coherent light which require coupling or matching of the lasers to the materials of the recording films.

On the other hand, the full format imaging method of this invention operates to produce an image reproduction utilizes a short pulse of high intensity non-coherent radiant energy simultaneously and substantially evenly applied in a full format pattern through a mask to the dispersion imaging material which is a rapid and substantially instantaneous process, in the range of microseconds, utilizes relatively inexpensive imaging equipment, such as, a mask and a Xenon flash tube, does not require close coupling or matching of time, power input and resolution, these factors being relatively independent, and can provide substantially even distribution of the globules in the imaged areas. Also, the full format imaging energy is of a broad spectral range and non-coherent so that there is no need for coupling or matching the energy to the dispersion imaging materials.

The differences in time for recording and imaging, in addition to saving time when it comes to high production imaging and recording operations, also provide higher resolution in the rapid full format imaging of this invention, vibration and motion having substantially no effect as in the slow scanning methods of the NCR articles. The inexpensive imaging equipment usable in this invention makes it particularly adaptable for inexpensive desk-top office copying equipment which is not the case for the laser scanning equipment of the NCR articles. The full format method of this invention is considerably less critical than the scanning laser method since close coupling of time, power input and resolution factors is not required as in the NCR articles. The substantially evenly distributed globules in the full format imaged areas of this invention provide a higher contrast between the unimaged and imaged areas than can be obtained by the scanning methods of the NCR articles where the globules cannot be substantially evenly distributed even if overlapping scanning were utilized.

An article (1) "Photography on Selenium" appearing at page 188 of the Apr. 12, 1949 issue of *The Journal of Photography* publication refers to work done by P. Selenyi which is also reported in the following articles: (2) "Photography on Selenium"—*Nature*, Volume 161, Jan. 3, 1948 to June 26, 1948, page 552; and (3) "Obtaining Photographic Pictures on Selenium by Crystallization Under the Influence of Light"—*Acta Physica*, II/2, Mar. 15, 1952, pages 129–138. Briefly, in accordance with these articles, a continuous layer or film or vitreous amorphous selenium is deposited on an aluminum or steel disc. The disc is placed on a metal plate preheated at 90°–95° C. and a diapositive image is projected on the surface of the selenium as it is being heated. In about 1–2 minutes a somewhat faint image appears. The image is produced by progressive crystallization of the amorphous selenium.

As pointed out in the articles, when vitreous amorphous selenium is heated, it slowly and gradually transforms itself into crystalline selenium, and when a light image is applied to the layer or film of the amorphous selenium as it is being heated, the crystallization is accelerated by the light and takes place faster where it is being irradiated by the light. The crystallization takes place gradually and in proportion to the intensity of the incident light applied while heating the selenium. There is no energy threshold value at which the crystallization or imaging takes place. The imaged selenium is viewed in the reflection mode, the crystalline image diffusing or scattering light. The crystalline image area is also a solid continuous film as is the unimaged amorphous area of the film. There are no discontinuities in the film in the imaged crystalline area comprising spaced globules and free space therebetween through which free space light can pass. Thus, the slow full format imaging method of the Selenyi articles is in all essential respects different from the rapid full format imaging method of this invention.

British Pat. No. 1,286,503 of Xerox Corporation has to do with a full format method for producing images by flash exposure. It discloses and emphasizes a discontinuous or particulate selenium layer of discrete selenium particles deposited on a substrate by specific deposition procedures set forth in the patent. The patent discloses two modes of imaging the discontinuous layer by flash exposure: (1) Fusion process—wherein, at lower exposure levels, the discrete selenium particles in the exposed areas fuse to adjacent particles in the exposed areas (Example II). This produces a more nearly continuous layer, as distinguished from the discontinuous or particulate layer, in the exposed areas; and (2) Evaporation process—wherein, at higher exposure levels, the discrete selenium particles in the exposed areas evaporate (Example I). This removes by evaporation selenium particles from the discontinuous or particulate layer in the exposed areas. In connection with this evaporation process, passing reference is also made to arsenic, cadmium, zinc and tellurium as possible particulate elements which may be used in this evaporation process.

The full format imaging methods of this British patent are in all essential respects different from the full format imaging method of the instant invention. Briefly, in the British patent, a particulate or discontinuous film has the discrete particles thereof either evaporate or fuse together to form a continuous film while, in the instant invention, a solid continuous film is dispersed into a discontinuous film comprising spaced globules and free space therebetween through which free space light can pass. These differences provide essential different characteristics, including imaging characteristics, optical density characteristics, and threshold and contrast or definition characteristics and, also, require different deposition procedures.

Basically, the relatively rapid full format imaging method of this invention differs in essential respects and in results obtained, for reasons set forth above, from the NCR articles having to do with a relatively slow laser scanning heat recording method, from the relatively slow full format imaging method of the Selenyi articles having to do with amorphous to crystalline transition, and the relatively rapid full format imaging method of the British patent having to do with evaporation of discrete particles of a discontinuous layer or the fusing together of discrete particles of the discontinuous layer into a substantially continuous layer. These articles and the British patent and the presently used full format imaging methods requiring pre-exposure protection and developing and fixing, taken singly or in combination, do not teach or contemplate the relatively rapid full format imaging method of this invention.

The energy is preferably non-coherent radiant energy including electromagnetic, electron and particle energy which may be projected onto said dispersion imaging material simultaneously in the plurality of discrete regions which are to receive the higher amount of energy. The image, comprising a plurality of discrete regions, may be provided by a plurality of energy sources, such as a beam of energy split by mirrors or the like directed onto the dispersion imaging material to form simultaneously the image thereon or it may be an image projected, for example, through a lense. For copying existing images, which is the preferred form of this invention, the energy is applied through an imaging mask. Of course, when an imaging mask is used, the image on the mask may be produced all at one time by a single exposure or it may be produced by successive exposure of portions of the image. In other words, a full format image may be produced in a portion of the dispersion imaging material in one exposure, and then full format imaging may be produced in other unimaged portions of the dispersion imaging material by subsequent exposures, whereby "add-on" capabilities are afforded by this invention. The energy is preferably applied in form of short pulses.

The most preferred embodiment of the method of the invention provides a new full format imaging method with comprises providing, preferably on a substrate, a layer or film of a dispersion imaging material, providing an energy source which is capable of emitting a short pulse of non-coherent radiant energy of an intensity sufficient to cause dispersion of said dispersion imaging material, providing between the energy source and the layer or film of dispersion imaging material masking means bearing an image of at least one area which has a high transmissiveness for said radiant energy and at least one other area which has lesser transmissiveness for said radiant energy. The layer or film of dispersion imaging material is thereafter subjected to a short pulse of the high intensity non-coherent radiant energy such that the radiant energy passes through the transmissive areas of said masking means and onto said layer or film of dispersion imaging material to cause dispersion of the dispersion imaging material in those areas which are receiving the higher amount of radiant energy to form a duplicate of the image represented on the mask.

For best results, the intensity and pulse width of the radiant energy pulse are adjusted such that the dispersion imaging material disperses in those areas which correspond to the portions of the mask, having the higher transmissiveness, and such that those areas of the dispersion imaging material which correspond to the portions of the mask, having the lesser transmissiveness for the energy, remain substantially in their original condition.

Excellent results have been obtained in the method of the invention with such materials which have relatively low melting points and relatively high boiling points such as metallic bismuth and lead and with such materials also having relatively low melting points and relatively high boiling points and which are electrical semiconductors such as tellurium and the like, because of their favorable physical properties such as favorable heat conductivity.

Advantageously suitable are the amorphous semiconductors, having low to medium melting points, particularly the chalcogenide elements other than oxygen and compositions containing them. These include the materials, which are known as memory materials and which are characterized by their ability of physical change from one condition to another under the effects of energy. These materials may be used in their amorphous or in their crystalline form. Many of these materials contain short or long chain polymers with little chemical crosslinking, so that the molecules can flow or diffuse exhibiting elastomeric properties under the effects of energy. Even those materials of this group, which contain crosslinks between molecules or atoms, can be readily converted into an easily flowable form by energy of moderate levels because the bonds may be readily broken under the effects of the applied energy.

The just mentioned changes can be produced by breaking bonds between molecules or atoms or reducing Van der Waals forces or other forces between molecules or atoms. The energy can produce electron hole pairs in these semiconductors and these carriers in turn can result in chain scission or reduction of other forces which permits mobility allowing movement or diffusion of atoms or molecules. Nucleation and other phenomena, as explained for instance, in application Ser. No. 143,781, filed on May 17, 1971, by Robert W. Hallman and Stanford R. Ovshinsky and entitled "Method for Producing Images and Product", may also be useful in explaining the effects observed in the method of the present invention. This increased mobility can initiate the further movement of the semiconductor material to cause dispersion in accordance with the present invention. This makes the memory materials excellent dispersion imaging materials.

Suitable semiconductor materials and memory materials are disclosed, for instance, in U.S. Pat. No. 3,271,591 issued on Sept. 6, 1966, to S. R. Ovshinsky and in U.S. Pat. No. 3,530,441 issued on Sept. 22, 1970, to S. R. Ovshinsky.

The method of the invention is based on the concept that those areas of the film of dispersion imaging material, which are subjected to a sufficient amount of energy disperse while those areas which receive lesser or no energy remain undispersed. The dispersion imaging material may be provided as a free layer or preferably it is provided on a substrate in form of a continuous thin film. In those areas of the film which receive sufficient energy, the dispersion imaging material substantially melts or softens or otherwise changes its state to a substantially fluid state, so that dispersion occurs.

The term "dispersion" as used herein means that a continuous thin film of solid material becomes discontinuous, when the internal energy of the material is increased above a critical threshold value as the result of absorption of energy. Important is only, that areas form in the film, which are more transmissive to or reflective for, for instance light, than other areas of the film, such that a detectable image consisting of a plurality of transmissive areas, and areas of lesser transmissiveness or reflectance is formed.

Dispersion may be simply cracking up of the film to form small discrete islands or discrete particles. Or the film may thin out in areas to become transmissive to, for instance light or other energy forms used for detection of the image, while it remains non-transmissive or of lesser transmissiveness in other areas thus forming a detectable image. Generally, it is desirable that, in the case of an opaque material, the thinned out sections have thinned out enough to permit at least 20% of the light, falling onto them, to be transmitted to the other side. In the case of light transmissive or partially transmissive materials, the dispersion imaging material should thin out, for dispersion, to at least 10% of its original thickness and preferably to less of its original thickness to produce distinct areas of greater transmissiveness or of other physically distinctive characteristics, such as surface reflection.

In the most preferred form of the method of the invention, the film of dispersion imaging material, where it receives sufficient energy, substantially melts or becomes soft to become substantially fluid, and flows together to form very small globules with free space therebetween or similar small structures of a size so small that they do not interfere with the normal light transmission or reflection of the substrate. Clarity and transmissiveness of the image is of course influenced by the choice of the substrate. The formation of the globules or similar structures is predicated on the wettability of the substrate material by the substantially molten or softened dispersion imaging material or by any other materials such as surfactants being present at the interphase between these materials. A wider choice of combinations of dispersion imaging materials and substrates is available and still better results are possible by the provision of an intermediary layer of a material which substantially reduces the wettability of the substrate by the substantially molten dispersion imaging material.

As stated, the above-mentioned materials including semiconductor materials, especially tellurium and the other chalcogenides and the various compositions containing these elements in admixture or in chemical combination are, in accordance with the invention, particularly useful as dispersion imaging materials in a method, where the energy supplied is radiant energy including particle energy which is capable of causing dispersion.

It was also found, in accordance with the invention, that the dispersibility of the dispersion imaging material can be facilitated and increased by the provision of a layer of a suitable material on top of the dispersion imaging material. This embodiment of the method of the invention permits the use of still lower levels and amounts of energy and may reduce the necessary pulse width with the benefits which will be described hereinafter in the detailed description of the invention. The amount of energy needed may also be reduced by the use of a substrate, which has a low heat conductivity.

Instead of using a separate mask for the imaging in accordance with the invention, an indigenous mask may be provided directly on the layer of the dispersion imaging material or on any layer or layers which may be present on top of the layer of the dispersion imaging material or, if desired, also on the reverse side of the substrate, if the substrate is energy transmissive per se.

Other objects, advantages and features of the invention will become apparent to those skilled in the art from the following description and claims of the invention and from the attached drawings in which:

FIG. 1 is a sectional view of a sheet of substrate with a film of dispersion imaging material disposed thereon and a mask provided thereupon, showing the selective exposure of the structure to radiant energy.

FIGS. 2 to 5 represent the structure of FIG. 1, showing various stages of the dispersion of the dispersion imaging material in the exposed area.

FIG. 6 is a representation of a photomicrograph, showing a 400X enlargement several dots of a halftone line screen image surrounded by the very small dispersed particles of the dispersion imaging material.

FIG. 7 is a sectional view of the dots of FIG. 6 taken along line 7—7.

FIG. 8 is a graphic representation comparing the amount of energy which causes damage in a silver halide emulsion mask and the amount of energy which effects dispersion of a tellurium dispersion imaging material on a cellulose acetate substrate.

Referring to the drawings, the structure shown in FIG. 1 comprises a substrate 12, such as cellulose acetate or Mylar, on which is disposed a thin film 14 of an opaque dispersion imaging material, such as elementary tellurium. Onto the layer 14 of dispersion imaging material has been placed imaging mask 16, such as an imaged, chromium mask, comprising opaque portions 18 and transparent portion 20. Arrows 22 represent non-coherent radiant energy, emitted by a suitable source such as a Xenon Flash Gun and falling through transparent portion 20 of the mask onto the layer 14 of dispersion imaging material.

As will be seen, the method of the invention consists in subjecting a layer or film of dispersion imaging material to a brief or short non-coherent radiant energy pulse, striking the layer in an imaged pattern, resulting in local substantially melting or softening of the dispersion imaging material in the areas receiving the higher energy and intensity. Thereby, light transmission is obtained by virtue of discontinuous islanding prior to the spontaneous freeze in the dispersed areas. The imaged pattern of energy used in the method of the invention may be achieved, as stated, by providing an imaging mask in the path of the energy striking the layer of dispersion imaging material. The imaged pattern of energy may also be achieved by simultaneously projecting radiant energy without a mask in a suitable pattern comprising simultaneously a plurality of energy regions.

In the preferred embodiment of the method of the invention, the area 24 of the layer 14 of dispersion imaging material undergoes, while it is subjected to the flash or pulse from the source of radiant energy, a series of physical changes until, at the termination of the exposure to radiant energy, the material in area 24 has assumed the structure represented in FIG. 5. In some cases, it may be sufficient, if the material has assumed at the termination of the exposure an intermediate structure, such as that represented, for instance, by FIG. 3 or by FIG. 4.

Depending on the dispersion imaging material used, and depending on the nature of the substrate and the type and character of the energy employed in any individual instance, the mechanism by which the dispersion occurs, may vary between various alternatives. The layer or film of dispersion imaging material may fracture and dispersion may be initiated at the fracture lines. The dispersion imaging material becomes soft, starting to thin out at various points and becoming thicker or forming humps at various other points. FIGS. 2 to 5 represent a section along a line at which the dispersion imaging material ultimately breaks up into the spheres shown in FIG. 5. The thinning out and the formation of humps shown in FIG. 2 continues to form a configuration such as shown in FIG. 3. Thereafter, the material breaks up to form separate humps 25 as shown in FIG. 4. Finally, the material making up each individual hump, flows together under the effect of the surface tension to form small globules 26 as shown in FIG. 5. These globules are adhering to the substrate and when the effect of the radiant energy ceases they cool and solidify. The globules 26 can be of very small size, for example, having a diameter of about 1 micron or less and are spaced from each other by a considerable distance.

Depending on the nature of the substrate, the surface of the substrate may have temporarily softened and the globules may be sunk, at least in part, into the top strata of the substrate.

Light can fall through the free space surrounding the individual globules. If the substrate 12 is transparent, as is the case with celulose acetate or Mylar, light will fall through area 24 characterized by the globules 26 in FIG. 5 and area 24 appears transparent, while areas 28 consisting of the unchanged, undispersed continuous film 14 of the dispersion imaging material do not transmit light if said dispersion imaging material is opaque. In this manner a high contrast image is formed. The globules 26 are so small that they are invisible, if inspected by the naked eye. They are also not visible at reasonable enlargements, such as are normally used to read out the image such as in the case of reading microfilm or microfiche. In fact with the preferred thickness of the film or layer 14 of dispersion imaging material and with the preferred operating conditions of the method of the invention, the globules 26 are so small and spaced so far apart, that the exposed area 24 of the layer 14 can be considered to be highly transparent even at considerable magnification. At magnifications of up to 15 to 20 times, the globules of dispersion imaging material do not become visible as individual entities.

Figure 5:
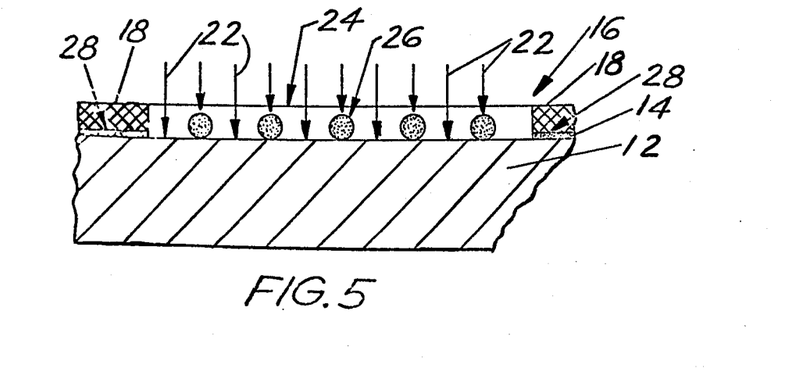

Similar considerations apply, if the substrate 12 is a non-transparent, light reflecting material such as heavily filled glossy paper. In this case the exposed area 24 of the paper surface reflects light and appears white without noticeable interference by the globules 26, while the opaque non-irradiated areas 28, if they are relatively non-reflective, appear dark and highly contrasted from the light colored reflective substrate.

The mechanism illustrated in FIGS. 1 to 5 represents only one possibility for the mechanism by which the dispersion of the dispersion imaging material takes place. Other possibilities include the cracking up of the layer 14 of the dispersion imaging material into small fractured pieces, which thereafter may soften or melt to form the individual globules or which may otherwise change their shape to provide the transmissive areas. The mechanism of dispersion varies also to a degree with the nature and composition of the dispersion imaging material used in each instance. Any other mechanism of dispersion is possible and this invention is not limited to any one theory of dispersion.

Figure 6:
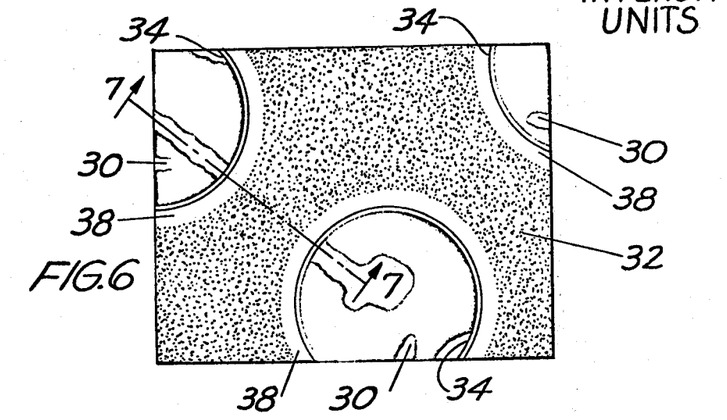
Figure 7:
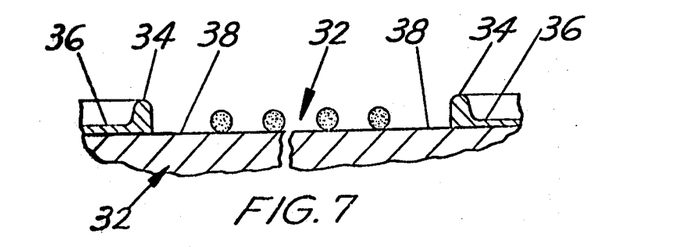

FIG. 6 is a representation of a microphotograph of a portion of a halftone line screen image produced in accordance with the method of the invention and showing parts of three of the dots 30 forming the image.

The image represented in FIG. 6 was obtained as follows. A structure was prepared which comprised on a thin film of Mylar a one micron thick film of tellurium adhering to the Mylar substrate. An imaging mask was prepared by copying a photograph through a 133 line screen onto a conventional silver halide emulsion from which a metal master was made. The metal master, with the metal side down was placed onto and in contact with the tellurium layer and a Xenon Electronic Flash Gun of 80 joules output was held close to the metal mask. The lamp was flashed to provide a pulse of one millisecond. The short pulse of non-coherent radiant energy from the flash gun passed simultaneously and substantially evenly through the transparent areas of the mask and simultaneously and substantially evenly onto the tellurium film in a full format pattern corresponding to the image represented by the mask.

The stippling in area 32 is representative of the actual size distribution and density and the substantially even distribution of the globules 26 shown in FIG. 5, in relation to the dots generated by the line screen. The representation in FIG. 6 shows that the new method of the invention is capable of reproducing halftone images in excellent manner. In the actual photomicrograph, dots 30 consisting of undispersed tellurium are black, while the areas 32 in between are exhibiting a slightly gray appearance, providing for high contrast. FIG. 6 shows also that the method of the invention produces images of very high resolution, definition and sharpness.

In some cases, the apparent or actual sharpness is still increased by the presence of a ridge 34 all around the edges of the unchanged layer 36 of dispersion imaging material. These ridges 34 are apparently formed by molten material which is drawn onto or flows onto the edge portions from the vicinity. In this manner, a ring-like area 38, which is relatively free from globules is formed around each of the dots 30. These areas 38 therefore appear in the photomicrograph absolutely white, bringing a further increase of apparent or actual contrast, definition and resolution. Depending on the nature of the dispersion imaging material, these ridges 34 may be more or less pronounced and sometimes they may be completely absent.

The dispersion imaging material has been shown hereinbefore in the dispersed areas as perfect spheres. Depending on the nature and composition of the dispersion imaging material, on the conditions applied in the method of operation and the nature of the substrate, the globules of dispersed material may be of any other form such as flattened spheres, "lenses", blisterlike particles, irregularly shaped globular or other forms such as flakes. To be useful in the method of the invention the globules are spaced from each other sufficient to produce a readily detectable difference in transmission or reflection in the dispersed areas as against the non-dispersed areas being in their original state. As stated hereinbefore the transmissive areas may also comprise thinned out dispersion imaging material instead of areas which are completely free from that material.

A dispersion imaging system of the kind described hereinbefore may be limited in its usefulness, if the imaging mask used therein is damaged by the radiant energy employed for bringing about the dispersion of the dispersion imaging material. If, for example, a plurality of copies is to be produced from a single master, it is not acceptable that the master is affected in any way by the individual exposures. Since the commonly used silver halide masters are easily damaged at high intensities of radiant energy, it is preferable that the dispersion of the dispersion imaging material is effected at an intensity level and at a pulse width which in themselves do not damage the silver halide master. In fact it is very desirable, that a good safety margin exists, so that large numbers of copies can be taken from a single silver halide master by the method of the invention, without any damage to the master.

The mechanism of damaging a silver halide gelatin emulsion appears to be following a threshold reaction type. If the individual exposures are held in their intensity and time below the threshold of damage, the individual exposures are not additive. Accordingly, a certain master may be used for a large number of exposures below the damage threshold energy, and even though the sum of the amounts of energy applied in the successive exposures greatly exceeds the threshold, no damage is done to the silver halide master.

The dispersion imaging system of the present invention permits that the energy of the individual exposure may be held below the damage threshold of the master, yet above the threshold for the dispersion of the dispersion imaging material, as is evidenced by the curves of FIG. 8 of the drawings. These curves show that in a wide range of intensities and coordinated pulse widths of the energy the dispersion of the dispersion imaging material of the invention can be effected with considerably lower amounts of energy than those amounts, which would damage a silver halide master imaging mask. A silver halide gelatin emulsion imaging mask can be exposed for very short times, without harm being done to intensities, which at longer times would cause complete destruction of the silver halide gelatin mask. Therefore it is important for a good dispersion duplicating system, that the intensity level of the radiant energy and the time of exposure are held below the corresponding values which would harm or damage the silver halide gelatin mask. On the other hand, it is desirable that the dispersion imaging material disperses at these same low energy levels. These requirements are excellently met in the dispersion imaging and duplicating system of the present invention, as will be set out hereinafter.

Figure 8:
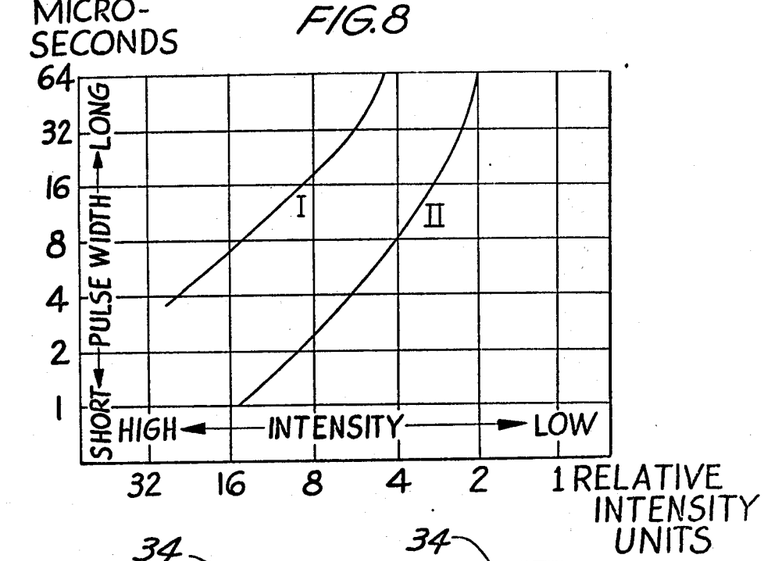

In the diagram of FIG. 8, pulse width in microseconds is plotted against intensity of the radiant energy in arbitrary units. Curve I was obtained by plotting the pulse widths in microseconds at varying intensities of a laser, at which the first noticeable damage could be observed on a developed, fixed and dried silver halide emulsion master. The master was represented by a negative microrecord of transparent letters on a black background contained on a cellulose acetate substrate. As can be seen from Curve I, with decreasing intensity the master could be subjected to considerably longer exposure times before the first signs of damage could be observed. In similar manner a layer of tellurium of one micron thickness deposited on a 7 mils thick film of cellulose acetate was subjected to pulses of the same laser at the various arbitrary intensity levels used for the exposure of the silver halide master in Curve I. The data obtained by observing complete dispersion at the various pulse widths and intensities of the laser, are plotted to result in Curve II, the plotted data representing the minimum intensities and pulse widths at which complete dispersion could be obtained.

It can be readily seen from the diagram in FIG. 8 that in the regions of energy shown the tellurium dispersion imaging material is completely dispersed at an intensity-pulse width combination which is far below that at which the silver halide master is damaged. For instance, at the intensity 16, the dispersion of the imaging layer is completed at a pulse width of about 1 microsecond. At the same intensity of 16 the silver halide mask shows the first signs of damage only if the pulse width is increased to 8 miroseconds. In other words, imaging can be successfully effected through the silver halide master at the intensity 16 with a pulse width of 1 microsecond with absolutely no damage to the silver halide master. A similarly large gap or differential between the first observable damage to the silver halie master and the completion of the dispersion in the imaging layer is present at the lower intensity levels covered by the curves. In this manner a wide range of combinations of intensity levels and pulse widths is available with the dispersion imaging materials of the invention for producing copies even from relatively sensitive masters.

It can be seen from the curves in FIG. 8, that at constant pulse width, the intensity ratio of energy causing damage to the silver halide gelatin emulsion and the itensity causing complete dispersion of the dispersion imaging material increases, as the pulse width decreases.

Principally, the method of the invention is operative with any material which has the capacity of dispersing by forming small globules or other small particles or small structures on a given substrate. The dispersion imaging materials include metals as well as electrical semiconductors and electric non-conductors such as various organic compounds. Metals are generally useful only in those embodiments of the method of the invention, where an image comprising a plurality of image areas is projected or where a master or imaging mask is used, which is relatively stable to the high levels of radiant energy needed for the dispersion of the metals. Generally, it was found that most metals require very high intensities for dispersion, which are too high to remain below the damage threshold of a silver halide mask. It was found, in accordance with the invention, that metals having a relatively low melting point and that metals on a low heat conductive substrate disperse more readily.

Most preferred are those dispersion imaging materials which are found among the low melting point metals, such as Bismuth or the like, and among the class of materials designated generally as electrical semiconductors, i.e. materials having an electrical conductivity of from $10^{-13}$ to $10^3$ ohm$^{-1}$cm$^{-1}$. It was found that these latter materials combine with a moderate electrical conductivity also a relatively low or intermediate heat conductivity, which makes them preferred dispersion imaging materials of the present invention as will be set out hereinafter. These semiconductor materials are usually also more brittle than metals. This brittleness can in some cases favor dispersion. Most preferred among these semiconductor materials are tellurium and the hereinbefore mentioned memory materials. These memory materials may be present in the respective layer or film in amorphous or in crystalline form, as may be desired.

To be useful as the dispersion imaging material in accordance with the invention, a material should have a relatively low melting or softening point, which is low enough to permit temporary melting or at least softening of the material under the effect of the available source of radiant energy. The energy needed for temporary melting or softening and dispersion of the selected dispersion imaging material should also not be greater than can be accommodated by the substrate whereon the dispersion imaging material is contained.

Another desirable property of a preferred dispersion imaging material is, that it has at or above its melting or softening point and at the imaging temperature reached in the imaging method, a viscosity which is low enough to permit its flowing together into small droplets, globules or similar structures or at least its thinning out sufficiently to form selected transmissive areas. At the same time the material should preferably also have a relatively high surface tension, when it is in the molten or softened state, to promote droplet or globule formation. Furthermore, a particular selected dispersion imaging material must also have a low wettability for the particular substrate, whereon it is to be used. If the wettability of the dispersion imaging material for its substrate is too large, insufficient dispersion and poor images may result. Thus a particular material may be an excellent dispersion imaging material on one substrate, while it is only poor on another substrate. This substrate dependency is an important consideration in the selection of a suitable dispersion imaging material for a given imaging system.

Another desirable property of a preferred dispersion imaging material is that it has a relatively low thermal conductivity as is found in the above-mentioned semiconductor materials. The benefit of the low thermal conductivity of the dispersion imaging material resides in the fact that it results in less lateral heat conduction, so that lateral bleed is minimized at the boundary between dispersed and non-dispersed areas. Images produced with these low to medium thermal conductivity dispersion imaging materials are therefore sharper and provide higher resolution. The low thermal conductivity results also in lesser heat loss to the substrate, so that less energy is needed for dispersion. This makes a system containing a dispersion imaging material having low thermal conductivity, holding other factors constant, far superior to systems such as those containing as the dispersion imaging material most metals.

If it is desired to produce visually detectable images, a further consideration is that the dispersion imaging material in form of the undispersed film is highly opaque and has, in the case of reflection viewing, a low reflectivity. If it does not have the required high opacity or low reflectivity, respectively in its deposited film state, as is the case in some of the otherwise suitable organic and inorganic materials, opacity or low reflectivity may be produced by adding organic dyes or very finely particulate pigment materials such as carbon black and the like.

Generally, it is not important whether or not some of the material vaporizes under the conditions of dispersion. However, if the imaging mask is placed onto or close to the layer of dispersions imaging material, it is preferred that the dispersion imaging material does not vaporize to any large extent while the dispersion proceeds. In this manner, the mask does not become contaminated upon repeated use. Generally, the above-mentioned metallic imaging material, such as Bismuth or the like, and semiconductor materials, and especially tellurium have, at dispersion temperature a satisfactory low vapor pressure, so that these materials are especially suitable for use with an imaging mask.

If the foregoing considerations are observed in the choice of a dispersion imaging material for a given system and substrate, generally excellent images can be obtained at relatively low energy levels of the radiant energy. In fact, the images produced in this manner have as high a resolution and as good a definition as can be produced by other known methods. By the use of a suitable highly opaque dispersion imaging material, the images show high contrast even at minimal thicknesses of the film of dispersion imaging material. Therefore, the method of the invention permits not only the production of images and copies from a master by full format flashing, without the need for safe lighting, developing and fixing, but results also in images of superior definition and resolution, making the method of the invention particularly suitable for duplication of microrecords and the like.

It was found that the chalcogenide elements, excepting oxygen, and the glassy or crystallized compositions containing them make excellent dispersion imaging materials for use in the method of the invention. One of the best dispersion imaging materials is tellurium and various compositions containing tellurium and other chalcogenides (parts being by weight) such as a composition of 92.5 atomic parts tellurium, 2.5 atomic parts germanium, 2.5 atomic parts silicon and 2.5 atomic parts arsenic; a composition of 95 atomic parts tellurium and 5 atomic parts silicon; a composition of 90 atomic parts tellurium, 5 atomic parts germanium, 3 atomic parts silicon and 2 atomic parts antimony; a composition of 85 atomic parts tellurium, 10 atomic parts germanium and 5 atomic parts bismuth; a composition of 85 atomic parts tellurium, 10 atomic parts germanium, 2.5 atomic parts indium and 2.5 atomic parts gallium; a composition of 85 atomic parts tellurium, 10 atomic parts silicon, 4 atomic parts bismuth and 1 atomic part thallium; a composition of 80 atomic parts tellurium, 14 atomic parts germanium, 2 atomic parts bismuth, 2 atomic parts indium and 2 atomic parts sulfur; a composition of 70 parts tellurium, 10 atomic parts arsenic, 10 atomic parts germanium and 10 atomic parts antimony; a composition of 60 atomic parts tellurium, 20 atomic parts germanium, 10 atomic parts selenium and 10 atomic parts sulfur; a composition of 60 atomic parts tellurium, 20 atomic parts germanium and 20 atomic parts selenium; a composition of 60 atomic parts tellurium, 20 atomic parts arsenic, 10 atomic parts germanium and 10 atomic parts gallium; a composition of 81 atomic parts tellurium, 15 atomic parts germanium, 2 atomic parts sulfur and 2 atomic parts indium; a composition of 90 atomic parts selenium, 8 atomic parts germanium and 2 atomic parts thallium; a composition of 85 atomic parts selenium, 10 atomic parts germanium and 5 atomic parts copper; a composition of 85 atomic parts selenium, 14 atomic parts tellurium and 1 atomic part bromine; a composition of 70 atomic parts selenium, 20 atomic parts germanium, 5 atomic parts thallium and 5 atomic parts silver; a composition of 70 atomic parts selenium, 20 atomic parts germanium and 10 atomic parts bismuth; a composition of 95 atomic parts selenium and 5 atomic parts sulfur and many more.

To summarize, generally, those materials which have
a melting or softening point in the range from about room temperature to about 1000° C. or higher,
a viscosity at or above the melting or softening point in the range from about $10^{-2}$ poises to about $10^5$ poises, whereby the lower range is generally useful only if the wettability of the chosen substrate is relatively low,
a thermal conductivity of from $10^{-4}$ (cal·cm)/cm$^2$·s·deg·C) to $10^{-1}$ (cal·cm)/(cm$^2$·s·deg·C) and
a surface tension in the softened or molten state of from 50 to 1000 dyns/cm
are generally excellent dispersion imaging materials. Some of the materials having a surface tension in the upper stated range may require ultrasonic vibration for operativeness. Generally, the materials having in molten form a low to medium surface tension within the stated range are preferred, though the surface tension should be high enough, in relation to the substrate, that the wettability of the substrate by the molten or softened dispersion imaging material is relatively low, so that the preferred globules are formed upon dispersion of the material by the radiant energy. Stated in other words, if the surface tension of the dispersion imaging material is low, generally only a narrower selection of suitable substrates is available. If the surface tension of the molten dispersion imaging material has higher values, then usually a larger range of substrates is available.

It is to be noted that no single property is decisive of whether or not a given material makes a good dispersion imaging material in the method of the invention. It is the combination of the above stated properties in consideration of the wettability of the chosen substrate, which permit the best possible selection of the dispersion imaging material for a given system and purpose including also such properties as opacity, reflection, adhesiveness to the substrate and abrasion resistance and other factors such as a relatively low vapor pressure at the melting or softening temperature or at the temperature reached in the dispersion step. As stated above, tellurium meets all these requirements in an excellent manner. Its low thermal conductivity makes it possible to use low intensity radiant energy of short duration for complete dispersion in the irradiated areas, producing a minimum of thermal bleed or fuzziness, and resulting in extremely sharp images of highest resolution and excellent definition. One or the other requirements set out above, may not be needed if dispersion is achieved without actual melting of the dispersion imaging material by one of the mechanisms set out hereinbefore. In this case, the choice of materials is still greater.

Some of the preferred dispersion imaging materials, useful in the method of the invention, are capable of reforming a continuous film or layer upon application of an amount of energy at a level which permits the forces of attraction between the imaging material and the substrate to respread the material. The reversibility of the dispersion makes it possible to erase the image and reuse the structure and to make corrections in an image, as may be desired. Redispersion may, for instance, be achieved by adding an agent which increases wettability to the substrate or which suitably affects the surface tension of the material; when the dispersed material is subjected to energy.

The dispersion imaging material as deposited may be in amorphous or crystalline form, as may be desired. Likewise, depending on the choice of material, the material in the dispersed phase may be amorphous or crystalline. By proper choice of the form and condition of the undispersed and the dispersed material, the contrast in the image may be further increased and the readout of the images, for instance by optical or electrical detection means may be further facilitated. By proper choice of transmissiveness or reflectance of the substrate and of the undispersed imaging material, it is possible to produce positive or negative images, as may be desired.

The topography of the image obtained by the method of the invention represents areas of different content of energy between the continuous and the dispersed phase of the dispersion imaging material.

It becomes apparent from the foregoing, that some care must be employed in selecting the intensity and time of application of the radiant energy for imaging through an imaging mask. Since some of the energy is passing also through the opaque areas of the imaging mask, the intensity and time of the energy application must be proportioned such that enough energy passes through the "transparent" or transmissive areas of the imaging mask to cause dispersion in the corresponding areas of the layer or film of dispersion imaging material, but the amount of energy applied must be small enough so that preferably no dispersion takes place in the areas of the layer or film of dispersion imaging material corresponding to the "opaque" or non-transmissive areas of the imaging mask. Of course, in accordance with the foregoing, the applied energy must also be held below the damage threshold for the master. In this manner, any desired number of high contrast duplicates may be produced from a single master. These precautions are usually not required, if the dispersion is achieved by projection of the energy. However, also in this case, it is desirable to proportion the energy such that not too great an excess of energy over that actually needed for dispersion is applied. This makes the method more economical and permits also a wider choice of substrates, and produces sharper images.

The layer or film of dispersion imaging material may be provided on the substrate by any convenient means, for instance by thermal evaporation and deposition in vacuum, by sputtering, by application in form of a solution with subsequent evaporation of the solvent and so forth.

There is a wide range of substrates available which may be successfully used in the method of the invention. The substrate may be inorganic such as silicate glass, ceramics, metals or mica. Preferred are generally organic substrates, which because of their flexibility, can be employed in rolls to provide continuous lengths of copying material. Organic substrates have also a considerably lower thermal conductivity than most of the inorganic substrate materials. The lower heat conductivity of the organic substrate permits the use of radiant energy of considerably lower intensity and much smaller energy input for successful dispersion of the dispersion imaging material. For this reason, those substrates, which have a thermal conductivity of below about $1.5 \times 10^{-3}$ (cal·cm)/(cm$^2$·s·deg·C) at room temperature are preferred.

The effect of the nature of the substrate is demonstrated by the following example. Using a tellurium film on a Mylar substrate, the tellurium may be readily dispersed by an 80 joule flash gun. Leaving everything equal but substituting glass for Mylar as the substrate, the flash of the 80 joule flash gun is no more sufficient for dispersion of the tellurium on the glass substrate. Window glass has about 5 times the heat conductivity of Mylar. This difference is sufficient to cause that great differential in the energy requirements.

Suitable organic substrates can be found among the polyesters such as Mylar. Other suitable organic substrates are polyamides, cellulose acetate, polystyrene and many more. Generally all those organic materials can be beneficially used as substrates, which can be brought into the form of a thin film and which show good affinity to the selected dispersion imaging material so that the latter can be adhered thereto and possesses a good abrasion resistance also after imaging. On the other hand, a selected substrate should have as low as possible a wettability for the molten dispersion imaging material, so that the dispersion imaging material is succesfully dispersed into the preferred small globules or similar particulate structures upon exposure to the radiant energy. This and the foregoing discussion shows, that the choice of the substrate depends in part on the selected dispersion imaging material and vice versa and on the desired effect. Generally useful are such materials as Mylar film and cellulose acetate film, both producing transparencies. Desirable are also low porosity, heavily filled papers of various grades or other opaque cellulosic products, for producing images for reflection viewing.

If a certain substrate is desired for use with a given dispersion imaging material, but cannot be used, because of too high a wettability, it is possible to provide an intermediate layer on the substrate, which reduces the wettability by a given dispersion imaging material, so that the dispersion imaging material readily disperses upon application of the radiant energy of the required energy level. This may be achieved, for instance, by coating the substrate prior to the deposition of the dispersion imaging material, with a material which has a low wettability for the dispersion imaging material, as, for example, vacuum depositing a thin film of aluminum oxide thereon. The same kind of surface treatment may also serve to form smaller particles in the dispersed phase, where the particle size would otherwise not be acceptable. By this expedient it is possible to greatly increase the choice of suitable substrates for a given dispersion imaging material. With some substrate dispersion imaging material combinations surfactants may be used for the erasure of the image by respreading of the dispersed material.

As a result of using extremely short pulses of energy, the organic substrates are not affected and not damaged, even though the temperature of the molten dispersion imaging material may temporarily exceed the melting temperature of the plastic. In this respect, it is helpful that the lower thermal conductivity of the organic substrate permits the use of lower power densities, which in turn is less harmful to the plastic or other organic substrate materials.

Any desired source of energy may be used, provided it produces the power density required for dispersion by the preferred short pulses of energy. Preferred for imaging through a mask are generally the devices known as electronic flash guns which are capable of producing short flashes of non-coherent radiant energy of, for instance, 10 microseconds or so to several hundred milliseconds or more and producing an energy output which is high enough to cause dispersion of the dispersion imaging material. The energy may be provided in form of light and/or heat, the former being converted into heat by absorption. Other sources and forms of energy such as flash bulbs, infrared lamps, particle beam generators etc. may be used, provided they provide temporarily the heat or other energy needed for melting or softening and dispersion of the dispersion imaging material. For full format flashing through a mask, however, the above-mentioned flash guns or similar devices of high light and heat output are preferred, with the beam of non-coherent radiant energy preferably being kept stationary in relation to the image mask and to the imaging structure containing the layer of dispersion imaging material. Any other suitable form of energy which is capable of dispersing the dispersion imaging material, such as electron energy, may be used.

The pulse width of the energy pulse applied to the dispersion imaging material to cause dispersion may vary in wide limits and depends to a large degree on the nature of the dispersion imaging material and on the intensity of the energy. With the above-mentioned flash guns the pulse width may be typically from about 10 microseconds up to 5 milliseconds or more.

Generally, it is preferred to place the imaging mask onto that side of the substrate which contains the layer of dispersion imaging material, so that the dispersion imaging material is subjected directly to the radiant energy. However, it is also possible in the case of a transparent or translucent or otherwise energy transmissive substrate, to place the mask on the opposite side so that the radiant energy passes through the substrate first. This mode of operation is desirable, for example in those instances where appreciable volatilization of the dispersion imaging material occurs. In this manner, it is avoided that a deposit of the dispersion imaging material is formed on the imaging mask or on the master, respectively. However, the preferred dispersion imaging materials of the invention do not appreciably volatilize upon flashing in the indicated manner. With these materials it is preferred to place the imaging mask directly onto the layer or film of dispersion imaging material or on any coating contained thereon, because of the greater sharpness and definition obtainable in this way.

The thickness of the layer or film of the dispersion imaging material may vary in wide limits, depending on the nature and physical properties of the dispersion imaging material used in each instance. It was found that with the preferred dispersion imaging materials, such as tellurium and tellurium containing compositions, thicknesses of the layer in the range from about 1000 Angstroms to about 50,000 Angstroms, and preferably of the order of about 5000 Angstroms to about 20,000 Angstroms provided most readily excellent images. With other dispersion imaging materials, the preferred thickness of the layer of dispersion imaging material may be as low as 500 Angstroms or less and up to 100,000 Angstroms or more, depending on the physical properties of the material and the effects desired. If no substrate is used, the layer of dispersion imaging material may be considerably thicker. It was observed that in many cases increase of the film thickness resulted in a decrease of the necessary intensity of the energy source and in fact therefore a lesser amount of energy was required to disperse the thicker films than was required to disperse the thinner films of the same material.

As becomes apparent from the foregoing, each particular imaging material of the invention requires a certain minimum intensity level and a corresponding time of exposure to bring about dispersion. In this respect, the imaging or dispersion reaction can be considered as a threshold reaction, dispersion being achieved when a dispersion imaging material is subjected to energy above a minimum amount which is characteristic of the specific structure to be imaged. Because of the threshold character of the reaction no safe lighting of the starting material and no fixing of the images is required.

It was now found that the energy required to disperse the material, or the threshold, respectively, may be lowered if suitable materials are coated onto the dispersion imaging material, for instance, in form of a very thin layer. This effect may be achieved with a variety of materials which by one mechanism or another have an effect on the dispersibility of the dispersion imaging material. Among the materials which have a striking effect in this respect may be mentioned gum arabic. The gum arabic may be coated onto the layer of dispersion imaging material in form of a dilute aqueous solution, for instance, by brushing it on, rolling it on, dipping or other suitable manner followed by drying. The layer of gum arabic deposited onto the layer of dispersion imaging material need by only very thin, for instance of a thickness from 1,000 to 100,000 Angstroms to exert its full effect. Such layer of gum arabic lowers the energy required for dispersion considerably.

It was found that the effect of such coatings may be further increased if the coating consists of a combination of two or more different materials. For instance, the addition of silver nitrate to the aqueous gum arabic solution further lowers the energy required for dispersion. These materials and coatings thereof are called hereinafter for convenience activators. When an activator is provided on the layer of dispersion imaging material, it further reduces the possibility of damage to the imaging mask or master by effectively reducing the energy needed for the dispersion in relation to the energy at which the imaging master would be harmed. In this manner, the choice of dispersion imaging materials suitable for use with a given imaging mask of a given damage threshold is greatly increased. Another possibility for avoiding harm to the imaging mask in combination with a given dispersion imaging material is the use of a more stable master, such as silver halide gelatin emulsion on glass. The increased thermal conductivity of glass over that of, for instance Mylar or cellulose acetate, greatly increases the heat stability of an otherwise identical silver halide gelatin emulsion.

The mechanism by which the activators of the invention operate depends on the nature and composition of the activator. Certain observations indicate that the following mechanisms may become effective to a greater or lesser extent, depending on the particular combination of activator and dispersion imaging material.

In the case of the presence of silver nitrate in the activator, the silver nitrate may dissociate under the effect of the applied light energy to form nuclei for the formation of the globules in the dispersion reaction.

As to the effectiveness of the organic activator, such as gum arabic, it was found that the gum arabic must be on the free surface of the dispersion imaging material to produce its greatest activating effect. If it is provided at the interface between the substrate and the layer of the dispersion imaging material, it is much less effective. The gum arabic provided on the surface of the dispersion imaging material may have a pronounced effect on the surface tension of the molten or softened dispersion imaging material. It may also provide nuclei for the formation of the individual globules or other structures formed in the dispersion process. Because gum arabic forms a tenacious layer, adhering to the dispersion imaging material, it may also become effective by promoting the breaking up of the film of the dispersion imaging material into small segments or particles, followed by softening or melting of the individual particles formed in this manner to form the globules or other particles in the course of dispersion.

Therefore, any material is suitable as an activator which exerts one or more of the stated effects or similar effects aiding in the dispersion and in the formation of the globular or other particles of the dispersion imaging material. Accordingly, any material which assists in the breaking up of the dispersion imaging material and/or in the formation of the dispersed phase to produce an apparent sensitization or activation of the dispersion reaction may be used with great benefit in the method of the invention as an activator.

Hereinbefore, the imaging and duplicating method of the invention has been described as employing a separate imaging mask or master. It was found that the method operates as efficiently if the mask is made part of the layer of dispersion imaging material to form an indigenous mask. The indigenous mask may be provided on the layer of dispersion imaging material or on the reverse side of the substrate, if the latter is transparent or translucent or otherwise energy transmissive. Of course, it may also be provided on any coatings which are contained on the film or layer of the dispersion imaging material.

The indigenous mask may be provided in a variety of ways. It may be produced by e.g. typing with dark carbon paper or ink onto the layer of a lighter colored dispersion imaging material. In this case, the dark areas produced by the typing absorb upon exposure to the radiant energy more energy so that the dispersion imaging material underlying these darker typed areas disperses to form a negative of the typed image! In a similar manner, one may use for typing on a dark colored dispersion imaging material a light colored ink or a light colored duplicating sheet which goes off a light colored or less absorptive material for the formation of the indigenous mask. In this case, a positive of the typed image is obtained upon exposure because the dark background absorbs more energy and disperses, leaving the typed areas undispersed. Any other method such as writing, drawing, or other mechanical means may be used to produce the indigenous mask on the layer of the dispersion imaging material or on the reverse side of the substrate, as the case may be.

The indigenous mask may also be produced by photographic means by providing a photosensitive layer on the layer of dispersion imaging material or on the reverse side of the substrate. In this embodiment of the method of the invention the photosensitive layer is exposed to lower levels of illumination, which do not in themselves disperse the dispersion imaging materials, but which are capable of producing the indigenous mask. Thereafter, the structure is subjected to higher levels of energy as described before.

Preferred are such photosensitive materials which do not require development, and which upon mere exposure produce distinct lighter or darker areas on a contrasting background. Suitable materials are, for instance, a layer of arsenic trisulfide over a thin silver layer or a vesicular diazo material, such as the product sold under the tradename "Kalvar". Another suitable photosensitive material is the so-called "Dry Silver" a product produced and sold by the 3M Company. All these materials or any other suitable photosensitive material which forms upon exposure to normal illumination levels selected areas which differ in their absorption characteristics from those of the unexposed material may be provided on the layer of dispersion imaging material or on the reverse side of the substrate and exposed to low level imaging radiation to form an image. Upon subsequent exposure of the imaged structure, containing the photographically produced indigenous mask, the final image is formed as described above by virtue of the fact that darker, more absorbent areas are present. Depending on whether the background is lighter or darker than the areas of the indigenous mask, a negative or positive image is obtained. Of course, when making the higher level exposure which causes the dispersion of the dispersion imaging material, the product of intensity of the energy and time of exposure is selected such that the more absorptive areas are receiving energy in an amount which causes dispersion, while the lesser absorptive areas receive energy in an amount below the threshold so that preferably no dispersion takes place in the areas of lesser absorption. Any other desired suitable method for producing an indigenous mask may be used with equal benefit. It is apparent from the foregoing that the imaging technique using the indigenous mask preferably employs whole format flashing rather than scanning or similar methods.

The images produced by the method of the invention may find wide use. If the substrate is transparent or translucent, the images may serve as projectable transparencies. Because of their excellent resolution and sharpness and definition they may especially also be used for producing microrecords. If the substrate is reflective, the images may serve for recording and duplicating purposes of all kinds. The dispersion imaging materials may be contained on a reflective surface, such as one of glossy paper.

By suitable choice of the substrate and dispersion imaging material, the image may serve directly as a lithographic printing plate, such as in the case that the substrate is hydrophilic and the dispersion imaging material is oleophilic or vice versa. No wet treatment is necessary for producing the offset lighographic printing plates in accordance with the present invention. It is to be noted that the dispersed phase of an oleophilic dispersion imaging material, because of the very small particle size, does not print and clean whites are obtained in spite of the fact that the oleophilic finely dispersed material is present in the hydrophilic areas. If an oleophilic substrate and an oleophilic dispersion imaging material is used, it is often possible to render, preferably after imaging by the method of the invention, the undispersed areas of the oleophilic dispersion imaging material hydrophilic, for instance, by a brief treatment in suitable salt solutions such as in aqueous solutions of silver nitrate, stannous chloride or of various soluble nickel salts, to produce a lithographic plate of excellent quality.

If desired, a thin metal layer may be employed between the layer of dispersion imaging material and the substrate, whereby the metal may be etched away in the dispersed areas of the image by a subsequent conventional etching step, with or without subsequent removal of the undispersed dispersion imaging material, to produce deep etch lithographic offset printing plates, printed circuits, arrays of electrical components produced in situ and the like.

By suitable choice of the substrate, and of the dispersion imaging material, and depending on the presence or absence of intermediary layers the image may be adapted to any desired use and purpose.

The images obtained by the method of the invention may be directly viewed or viewed by help of suitable reflectance or transmission readers. The images may also be read by detection equipment using optical, electrical or other physical principles in their operation. Any of the known detection methods may be used for reading out of the images.

The invention will be further illustrated by the following examples, parts being by weight.

EXAMPLE I

A one-half micron thick film of tellurium was deposited by sputtering techniques on a 5 mil thick Mylar film.

Onto the tellurium film was placed a chromium mask containing a microrecord representation and the tellurium film was subjected through the mask to a ½ millisecond flash of a Honeywell 700 electronic flash unit, held at a distance of one inch from the film plane.

A positive transparency copy of the microrecord, having excellent resolution and definition was obtained.

EXAMPLE II

A one-half micron thick film of tellurium was deposited by the vacuum deposition technique on a 5 mil thick cellulose acetate film.

The metal mask of Example I was placed onto the tellurium film, and the film was exposed through the mask to a 10 millisecond flash of a GE No. 5 clear flash bulb placed at a distance of one-half inch.

A positive transparency copy of the microrecord, having excellent resolution and definition was obtained.

The experiment was repeated, however, applying by dipping a thin coating of gum arabic onto the tellurium film. After drying, the film was exposed as before. Dispersion of the tellurium and formation of the copy of the microrecord could be achieved at a distance of the flash bulb of about one inch.

In another experiment, the film of tellurium was dipped into a dilute aqueous solution of gum arabic and silver nitrate. After drying, the film was exposed as before. Dispersion of the tellurium and formation of an excellent copy of the microrecord could be achieved at a distance of the flash bulb of about 2 inches. When a master consisting of a silver halide emulsion on cellulose acetate was used, dispersion of the treated tellurium could be readily achieved without damage to the silver halide mask.

EXAMPLE III

The foregoing Examples I and II were repeated, however, substituting for the tellurium the following materials:

(a) A dispersion imaging composition consisting of 83 atomic parts tellurium, 13 atomic parts germanium, 2 atomic parts antimony and 2 atomic parts sulfur.

(b) A dispersion imaging composition consisting of 50 atomic parts tellurium and 50 atomic parts sulfur.

(c) A dispersion imaging composition consisting of 95 atomic parts tellurium and 5 atomic parts germanium.

(d) A dispersion imaging composition consisting of 95 atomic parts selenium and 5 atomic parts tellurium.

(e) A dispersion imaging composition consisting of 95 atomic parts selenium and 5 atomic parts sulfur.

(f) A dispersion imaging material consisting of antimony trisulfide.

(g) A dispersion imaging material consisting of bismuth.

(h) A dispersion imaging composition consisting of 95 atomic parts tellurium and 5 atomic parts copper.

(i) A dispersion imaging composition consisting of 95 atomic parts tellurium and 5 atomic parts tin.

(j) A dispersion imaging material consisting of selenium.

(k) A dispersion imaging composition consisting of 30 atomic parts arsenic, 30 atomic parts sulfur and 40 atomic parts tellurium.

(l) A dispersion imaging material consisting of lead.

The films of these materials were flashed through a mask by a Honeywell 700 electronic flash gun. The distance of the flash gun from the film plane was varied between one-eighth inch and one inch. The pulse width was in all instances one-half millisecond. The film thickness was varied between 0.2 micron and one micron.

In all cases, dispersion of the dispersion imaging material was achieved with the formation of images of excellent definition and sharpness.

Numerous other modifications may be made to various forms of the invention described herein without departing from the spirit and scope of the invention.

We claim:

1. The method of producing an image by full format imaging, which method comprises the step of providing on a substrate a solid continuous film of a dispersion imaging material which, upon application of a short pulse of high intensity radiant energy in an amount sufficient to increase the absorbed energy in the material above a certain threshold value, is capable of changing to a substantially molten state in which the surface tension of the material acts to cause the continuous film where subject to said energy pulse to change to a discontinuous film comprising spaced globules and free space therebetween in the film which are frozen in place following said energy pulse and through which free space light can pass, the step of applying a short pulse of high intensity non-coherent radiant energy through an imaging mask having a full format image pattern including portions of higher transmissiveness and portions of lower transmissiveness for said energy pulse to said continuous film of dispersion imaging material simultaneously and substantially evenly in a full format pattern, wherein said full format pattern of the simultaneously and substantially evenly applied energy pulse includes a plurality of areas in which the intensity and pulse width of said energy is sufficient to increase simultaneously and substantially evenly the absorbed energy in the corresponding pattern areas of said dispersion imaging material above said threshold value, and wherein the amount of the radiant energy pulse supplied in a plurality of other areas is insufficient to increase the absorbed energy above said threshold value, thereby causing the material of the continuous film in those pattern areas simultaneously and substantially evenly receiving the higher amount of the non-coherent radiant energy pulse to change to the discontinuous film comprising the spaced globules and free space in the film which are substantially evenly distributed in said pattern areas and through which free space light can pass to provide at one time a stable finished full format image pattern of said discontinuous film in the continuous film corresponding to said full format pattern of the energy pulse.

2. The method of producing an image by full format imaging which comprises the step of providing on a substrate a solid continuous film of a dispersion imaging material, the step of providing energy emitting means which are capable of emitting a short pulse of high intensity non-coherent radiant energy of an intensity sufficient to effect a change to a substantially molten state in the material in which the surface tension of the material acts to cause the continuous film where subject to said energy pulse to change to a discontinuous film comprising spaced globules and free space therebetween in the film which are frozen in place following said energy pulse and through which free space light can pass, the step of providing between said energy emitting means and said continuous film of dispersion imaging material masking means representing a full format image pattern and having a plurality of portions which are highly transmissive for said non-coherent radiant energy pulse and a plurality of other portions which have a lesser transmissiveness for said radiant energy pulse, and the step of subjecting through said masking means said continuous film of dispersion imaging material to a short pulse of said high intensity non-coherent radiant energy such that said non-coherent radiant energy pulse simultaneously and substantially evenly passes through said masking means and simultaneously and substantially evenly onto said continuous film of dispersion imaging material in a full format pattern corresponding to the full format image pattern represented by said masking means to change the material of the continuous film in those pattern areas which simultaneously and substantially evenly receive the higher amount of the non-coherent radiant energy pulse to a substantially molten state for causing the continuous film thereat to change to the discontinuous film comprising the spaced globules and free space in the film which are substantially evenly distributed in said pattern areas and through which free space light can pass to form at one time a stable finished full format discontinuous film duplicate of the full format image pattern represented by said masking means in the continuous film.

3. The method of claim 1 in which the dispersion imaging material is an electrical semiconductor material having moderate thermal conductivity.

4. The method of claim 1 in which the dispersion imaging material is an inorganic non-metallic material.

5. The method of claim 1 in which the dispersion imaging material is a composition comprising at least one chalcogenide element other than oxygen.

6. The method of claim 1 in which the dispersion imaging material is a composition comprising tellurium.

7. The method of claim 1 in which the dispersion imaging material is tellurium.

8. The method of claim 1 in which the substrate is a transparent material.

9. The method of claim 1 in which the substrate is a material having a heat conductivity lower than $1.5 \times 10^{-3}$ (cal·cm)/cm$^2$·s·deg·C).

10. The method of claim 1 in which the substrate is a transparent organic material.

11. The method of claim 1 in which the substrate is a film of polyethylene terephthalate.

12. The method of claim 1 in which the substrate is a film of cellulose acetate.

13. The method of claim 1 in which the solid continuous film of dispersion imaging material has a thickness of from about 1,000 to about 50,000 Angstroms.

14. The method of claim 1 in which the solid continuous film of dispersion imaging material has a thickness of from about 500 to about 20,000 Angstroms.

15. The method of claim 1 in which the short pulse of high intensity radiant energy has a duration of from about 1 to about 5,000 microseconds.

16. The method of claim 1 in which the imaging mask comprises a silver image provided by a silver halide gelatin emulsion having a threshold of thermal damage.

17. The method of claim 16 in which the threshold of thermal damage to the imaging mask has a certain value, and in which the dispersion of the said dispersion imaging material is effected by an amount of energy lying substantially below that amount of energy which corresponds to said certain value of the thermal threshold of thermal damage to said imaging mask.

18. The method of claim 1 in which the substrate is an organic film.

19. The method of claim 2 in which said radiant energy is provided by an electronic flash gun.

20. The method of claim 1 in which the said energy is applied to a solid continuous film of dispersion imaging material which has a melting point of not higher than about 1000° C., a viscosity at the melting point in the range from about $10^{-2}$ poises to about $10^5$ poises, a thermal conductivity of from $10^{-4}$ to $10^{-1}$ (cal·cm)/cm²·s·deg·C) and a surface tension in the molten state of from 50 to 600 dyns/cm.

21. A method according to claim 1 wherein the dispersion imaging material is an electrical semiconductor having an electrical conductivity of from about $10^{-13}$ to about $10^3$ ohm$^{-1}$·cm$^{-1}$.

22. A method according to claim 1 wherein the dispersion imaging material comprises bismuth.

* * * * *